United States Patent
Funada (10) Patent No.: US 8,595,539 B2
(45) Date of Patent: Nov. 26, 2013

(54) DISPLAY APPARATUS FOR AUTOMATICALLY ADJUSTING QUANTIZATION CLOCK PHASE ACCORDING TO DIFFERENT THRESHOLD VALUES IN A DISPLAY APPARATUS

(75) Inventor: Masahiro Funada, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 344 days.

(21) Appl. No.: 12/985,612

(22) Filed: Jan. 6, 2011

(65) Prior Publication Data

US 2011/0164179 A1    Jul. 7, 2011

(30) Foreign Application Priority Data

Jan. 6, 2010 (JP) .................................. 2010-001508

(51) Int. Cl.
G06F 1/00 (2006.01)
H04N 5/04 (2006.01)

(52) U.S. Cl.
USPC .......................................... 713/500; 348/500

(58) Field of Classification Search
USPC .................... 713/400, 500; 348/500
See application file for complete search history.

(56) References Cited

U.S. PATENT DOCUMENTS 6,340,993 B1    1/2002  Hasegawa et al.

FOREIGN PATENT DOCUMENTS

JP    11-177847 A    7/1999
JP    2000-122624 A    4/2000

*Primary Examiner* — Thomas Lee
*Assistant Examiner* — Phil Nguyen
(74) *Attorney, Agent, or Firm* — Rossi, Kimms & McDowell LLP (57) ABSTRACT

The display apparatus includes an AD converter converting an analog video signal into a digital video signal, a phase adjuster and a horizontal start position detector. The detector detects a horizontal start position where an output value of the AD converter becomes a minimum value that exceeds a threshold level in a video horizontal direction. The phase adjuster acquires a start position change phase where the horizontal start position is changed. The phase adjuster calculates a first phase period where the analog video signal starts its transition from a first level to a second (higher) level and then ends the transition. The phase adjuster sets a phase not included in the first phase period as an adjusted phase of the quantization clock.

8 Claims, 8 Drawing Sheets

DISPLAY APPARATUS FOR AUTOMATICALLY ADJUSTING QUANTIZATION CLOCK PHASE ACCORDING TO DIFFERENT THRESHOLD VALUES IN A DISPLAY APPARATUS

BACKGROUND OF THE INVENTION

1. Field of the Invention

The present invention relates to a display apparatus having an automatic quantization clock phase adjustment function, such as a projector and a monitor.

2. Description of the Related Art

Displaying an analog video signal showing documents, graphics and the like created by a computer on a display apparatus requires matching a quantization clock for the analog video signal and an effective image area of the analog video signal in the computer with those in the display apparatus. Such a display apparatus generally has a signal format table in which information on attributes of horizontal and vertical synchronization signals such as frequencies and polarities is correlated with the quantization clock and the effective image area. Reading such attributes of synchronization signals output from the computer enables discrimination of their signal formats.

The display apparatus normally generates the quantization clock needed for quantization of the analog video signal output from the computer by multiplication of the horizontal synchronization signal. An appropriate frequency of the quantization clock can be known from the above-described information of the synchronization signal. However, appropriate phases of the synchronization signals are different in respective computers. This is because the horizontal synchronization signal and the video signal output from the computer have a time difference, and the time differences are different in the respective computers.

Therefore, performing good quantization requires the display apparatus to have an automatic adjustment function of a phase of the quantization clock to compensate for the above-mentioned time difference. The phase of the quantization clock is hereinafter referred to as a "quantization clock phase" or a "clock phase".

Japanese Patent Laid-Open No. 2000-122624 discloses an art relating to such automatic quantization clock phase adjustment. The disclosed art first detects video levels of an input analog video signal at a horizontal video start position (coordinates) and a horizontal video end position (coordinates) at each clock phase to combine the detected video levels at the same clock phase. This provides video level data that reflects a leading edge and a trailing edge of the input analog video signal.

Then, the disclosed art regards a certain clock phase where the video level data becomes a maximum level as a stable phase where the video level is little changed, and fits the clock phase to be adjusted to the stable phase, thereby performing the automatic quantization clock phase adjustment.

On the other hand, Japanese Patent Laid-Open No. 11-177847 discloses the following art. The disclosed art first performs at each clock phase a process to obtain an absolute difference value of at least one pair of pixels adjacent to each other in one frame of an input video signal. Then, the disclosed art adjusts a frequency and a phase of the quantization clock such that the obtained absolute difference value becomes maximum.

However, the art disclosed in Japanese Patent Laid-Open No. 2000-122624 only observes transition of one pixel at each of the horizontal video start position and the horizontal video end position. Therefore, noise mixing in the video signal during its transmission from a video signal providing apparatus to a quantizing part in the display apparatus and the video level change generated due to change of a source video itself at the horizontal video start position and the horizontal video end position significantly influence the video level data, which deteriorates accuracy of the automatic quantization clock phase adjustment.

Moreover, the art disclosed in Japanese Patent Laid-Open No. 11-177847 is based on a premise that there are some image areas where an inclination of change of the video level is reversed at each pixel, and provides better adjustment accuracy as such image areas increase. Thus, in video signals often used for displaying presentation's titles which include few image areas where the inclination of the change of the video level is reversed at each pixel, the absolute difference value of the adjacent pixels is less changed even if the frequency and phase of the quantization are adjusted, and therefore the art cannot perform correct quantization clock phase adjustment.

SUMMARY OF THE INVENTION

The present invention provides a display apparatus capable of improving accuracy of automatic quantization clock phase adjustment for a case where noise mixes in a video signal during its transmission from a video signal providing apparatus to a quantizing part of the display apparatus and for a case where the video signal includes few image areas where an inclination of video level change is reversed at each pixel.

The present invention provides as one aspect thereof a display apparatus including an AD converter configured to convert an analog video signal into a digital video signal, a phase adjuster configured to adjust a phase of a quantization clock in the AD converter with respect to the analog video signal, a horizontal start position detector configured to detect a horizontal start position where an output value of the AD converter becomes a minimum value that exceeds a threshold level in a video horizontal direction, and a threshold level adjuster configured to adjust the threshold level. The phase adjuster is configured to perform a quantization clock phase adjustment process including a phase acquisition process to acquire, for each of at least two threshold levels and by sequentially changing an adjustable phase of the quantization clock, a start position change phase where the horizontal start position is changed, a first phase period calculation process to calculate a first phase period where the analog video signal starts its transition from a first level to a second level higher than the first level and then ends the transition, and a phase setting process to set a phase that is not included in the first phase period as an adjusted phase of the quantization clock.

The present invention provides as another aspect thereof a display apparatus including an AD converter configured to convert an analog video signal into a digital video signal, a phase adjuster configured to adjust a phase of a quantization clock in the AD converter with respect to the analog video signal, a horizontal end position detector configured to detect a horizontal end position where an output value of the AD converter becomes a maximum value that exceeds a threshold level in a video horizontal direction, and a threshold level adjuster configured to adjust the threshold level. The phase adjuster is configured to perform a quantization clock phase adjustment process including a phase acquisition process to acquire, for each of at least two threshold levels and by sequentially changing an adjustable phase of the quantization clock, an end position change phase where the horizontal end position is changed, a second phase period calculation process to calculate a second phase period where the analog video signal starts its transition to a first level from a second level higher than the first level and then ends the transition, and a phase setting process to set a phase that is not included in the second phase period as an adjusted phase of the quantization clock.

Further features of the present invention will become apparent from the following description of exemplary embodiments with reference to the attached drawings.

DESCRIPTION OF THE PREFERRED EMBODIMENTS

Exemplary embodiments of the present invention will hereinafter be described with reference to the accompanying drawings.

Figure 2:
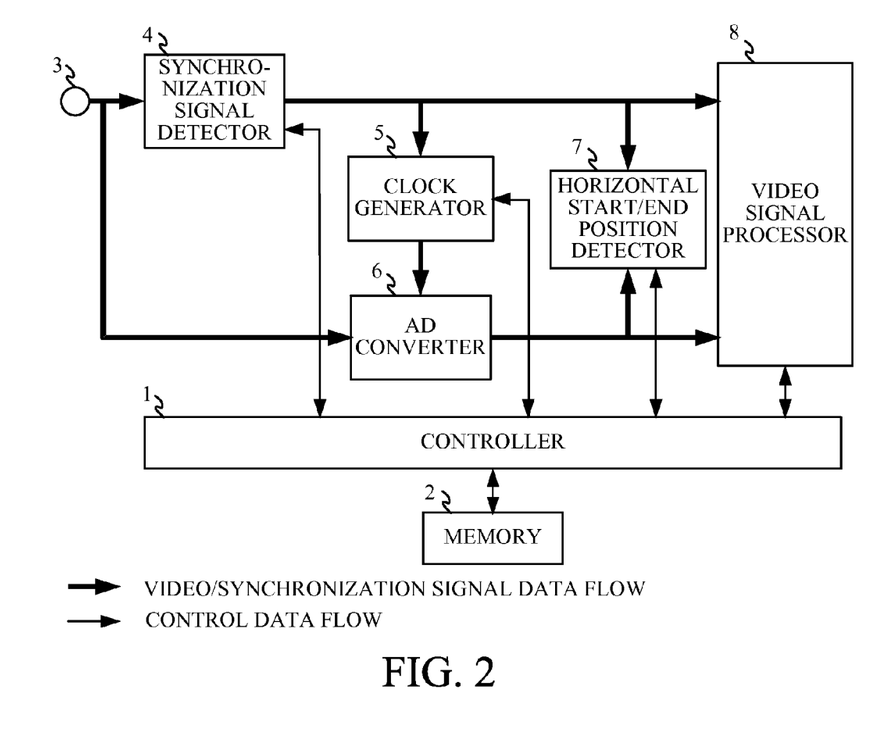
FIG. 2 is a block diagram showing a configuration of the display apparatus of the embodiment.

First, description will be made of a configuration of a display apparatus that is an embodiment of the present invention with reference to FIG. 2.

A controller 1 controls operations of respective parts in the display apparatus according to various computer programs stored in a memory 2.

A D-Sub15 pin terminal 3 is an input terminal for an RGB analog video signal from a video signal providing apparatus such as a computer.

A synchronization signal detector 4 performs determination of presence of horizontal and vertical synchronization signals, detection of a period of the horizontal synchronization signal and detection of a counted number of the horizontal synchronization signals in one period of the vertical synchronization signal (that is, a number of vertical lines). Moreover, the synchronization signal detector 4 outputs interrupt signals synchronizing with the vertical synchronization signal to the controller 1.

A clock generator 5 generates and outputs a quantization clock signal (hereinafter referred to as a "quantization clock") generated by multiplication of the horizontal synchronization signal, a factor of the multiplication being set by the controller 1. A phase of the quantization clock is also set by the controller 1. In this embodiment, the phase of the quantization clock can be variably set to, as an example, 32 steps from 0 to 31.

An AD converter 6 performs AD conversion of the analog video signal with the quantization clock output from the clock generator 5 to output an RGB digital video signal and a clock signal.

A horizontal start/end position detector 7 detects a start position of an effective image area in a video horizontal direction (horizontal effective area) and an end position thereof in the same direction. These horizontal start position and horizontal end position are determined on the basis of a threshold level set by the controller 1. The threshold level can be set to ⅛, ⅜, ..., or ⅞ with respect to a white level.

The horizontal start/end position detector 7 starts clock counting in response to input of the horizontal synchronization signal. Then, the detector 7 sets a position where the output value (that is, the value of the digital video signal) from the AD converter 6 first becomes a minimum value exceeding a predetermined threshold level in any channel of RGB as the horizontal start position, and sets a position where the output value from the AD converter 6 last becomes a maximum value exceeding the threshold level as the horizontal end position. The horizontal start/end position detector 7 keeps holding the minimum value at the horizontal start position and the maximum value at the horizontal end position until a next vertical synchronization signal is input thereto.

The horizontal start/end position detector 7 resets the held value in response to input of the vertical synchronization signal, and outputs the horizontal start and end positions in a previous frame in response to an acquisition request from the controller 1. The horizontal start/end position detector 7 outputs "0" when there exists no pixel whose level exceeds the threshold level.

A video signal processor 8 performs appropriate conversion processing on the RGB digital video signal to output the converted video signal to a displaying part (not shown), and thereby a video is displayed thereon.

Next, description will be made of an automatic adjustment function of the phase of the quantization clock set to the clock generator 5 by the controller 1 serving as a threshold adjuster and a phase adjuster with reference to FIGS. 1A to 1D. The phase of the quantization clock set to the clock generator 5 is hereinafter referred to as a "quantization clock phase" or "clock phase".

Figure 1A:
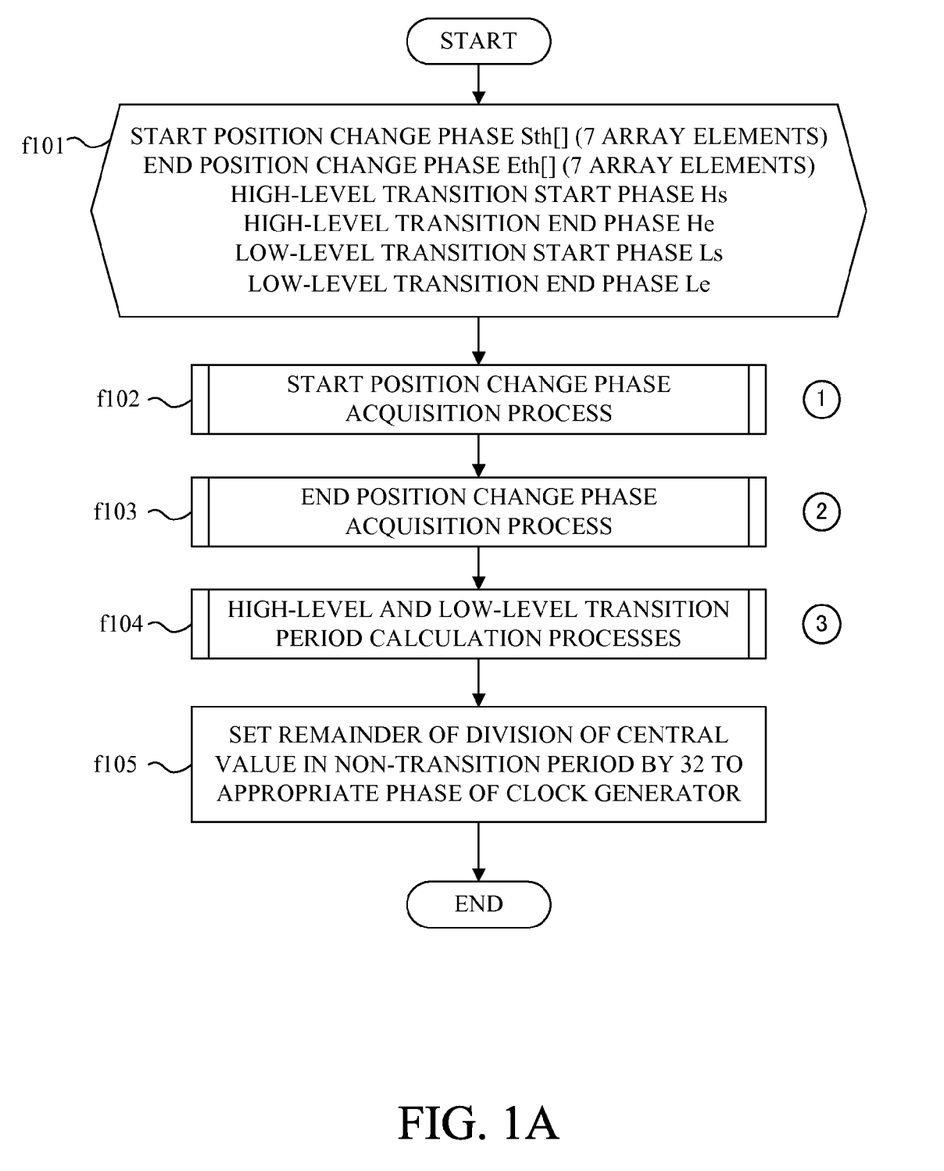
FIGS. 1A to 1D are flowcharts showing automatic quantization clock phase adjustment performed by a display apparatus that is an embodiment of the present invention.

In a main routine, at step f101, the controller 1 defines various variables. A start position change phase Sth[ ] has an array including seven array elements, and stores a start position change phase at which the horizontal start position detected by the horizontal start/end position detector for each threshold level is changed between consecutive phases. An end position change phases Eth[ ] has an array including seven array elements, and stores an end position change phase at which the horizontal end position detected by the horizontal start/end position detector 7 for each threshold level is changed between consecutive phases.

A high-level transition start phase Hs and a high-level transition end phase He respectively store a start phase and an end phase of a transition period, that is, a high-level transition period (first phase period) where the analog video signal is transited from a low level (first level) to a high level (second level). A low-level transition start phase Ls and a low-level transition end phase Le respectively store a start phase and an end phase of a transition period, that is, a low-level transition period (second phase period) where the analog video signal is transited from the high level to the low level.

At step f102, the controller 1 performs a start position change phase acquisition process (subroutine 1), which will be described below, to acquire values of the start position change phases Sth[0] to Sth[6].

At step f103, the controller 1 performs an end position change phase acquisition process (subroutine 2), which will be described below, to acquire values of the end position change phases Eth[0] to Eth[6].

At step f104, the controller 1 performs high-level and low-level transition period calculation processes (subroutine 3) which respectively correspond to first and second phase period calculation processes and which will be described later. That is, the controller 1 calculates, from the start and end position change phases acquired at the previous steps, the high-level transition start phase Hs, the high-level transition end phase He, the low-level transition start phase Ls and the low-level transition end phase Le.

Figure 7:
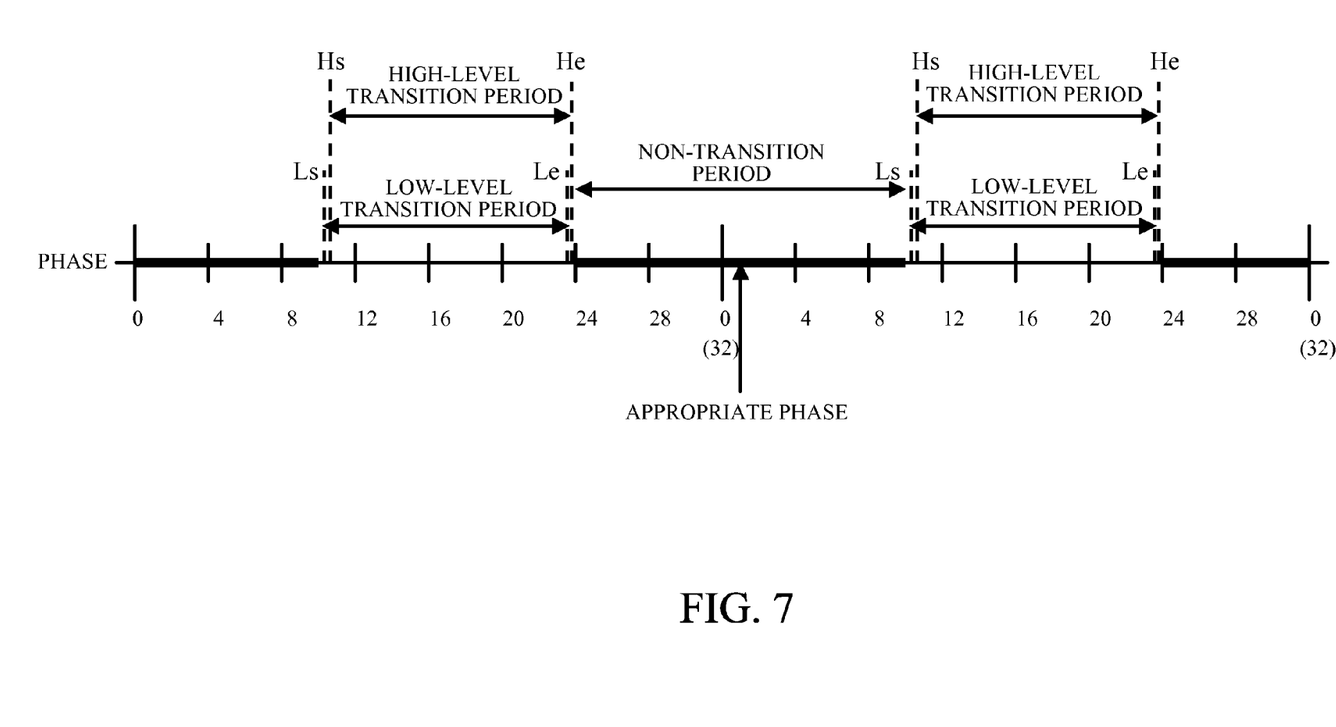
FIG. 7 shows calculation of an appropriate phase in the embodiment.

At step f105, the controller 1 calculates a central point (central value) of a phase period that is not included in either of the high-level transition period from the high-level transition start phase Hs to the high-level transition end phase He and the low-level transition period from the low-level transition start phase Ls to the low-level transition end phase Le. This phase period not included in either of the high-level and low-level transition periods is hereinafter referred to as a "non-transition period". This calculation of the central point of the non-transition period corresponds to an appropriate phase setting process. In this calculation, the controller 1 treats the phase 0 and the phase 31 as being adjacent to each other. FIG. 7 shows an image of the appropriate phase setting process performed at step f105. The controller 1 finally sets, to the clock generator 5 as an appropriate phase (adjusted phase), a remainder of division of the calculated central value by 32 corresponding to one clock period. Thus, the controller 1 ends the process.

Figure 1B:
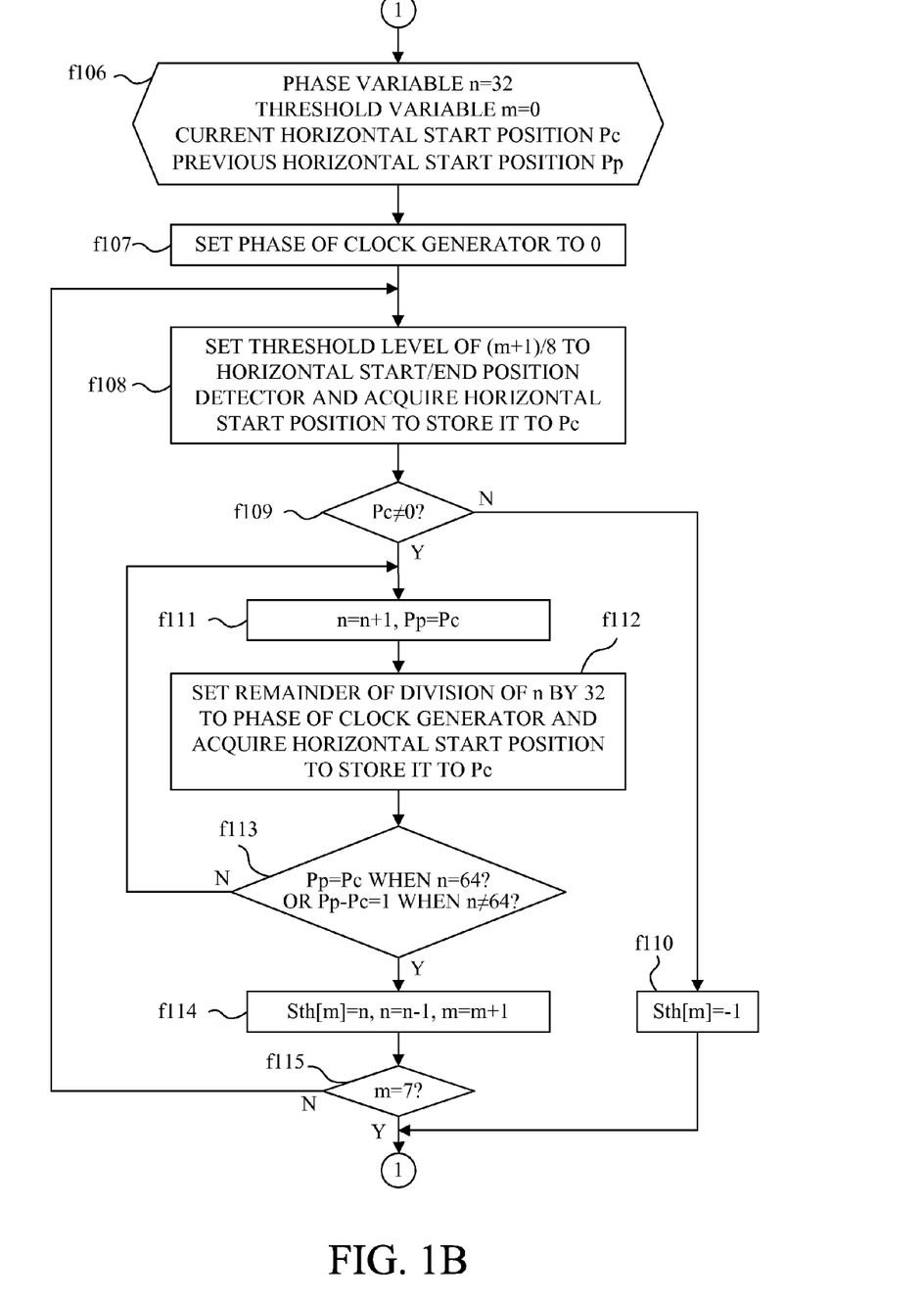

Detailed description will be made of operations in the start position change phase acquisition process (subroutine 1). At step f106, the controller 1 defines various variables. A phase variable (adjustable phase) n is a variable for managing the phase set to the clock generator 5, and its initial value is 32 corresponding to one clock. The phase variable n is sequentially changed. A threshold variable m is a variable for managing the threshold level set to the horizontal start/end position detector 7, and its initial value is 0. Threshold variable m is also sequentially changed.

A current horizontal start position Pc stores the horizontal start position acquired from the horizontal start/end position detector 7 at a currently set phase. A previous horizontal start position Pp stores the horizontal start position acquired from the horizontal start/end position detector 7 at a previously set phase.

At step f107, the controller 1 sets the phase of the clock generator 5 to 0.

At step f108, the controller 1 sets a value of the threshold level of (m+1)/8 to the horizontal start/end position detector 7, and then acquires the horizontal start position and stores it to the current horizontal start position Pc after waiting a time corresponding to at least two vertical synchronization interrupt signals output from the synchronization detector 4 as a time until the threshold level setting is reflected to the output of the horizontal start/end position detector 7.

At step f109, the controller 1 determines whether or not the current horizontal start position Pc is 0. If determining that the current horizontal start position Pc is 0, the controller 1 proceeds to step f110.

At step f110, the controller 1 stores "−1" showing that there exists no pixel whose level exceeds the threshold level to the start position change phase Sth[m]. Then, the controller 1 ends this process.

On the other hand, if determining that the current horizontal start position Pc is other than 0 at step f109, the controller 1 moves to a process for detecting a phase at which the horizontal start position is changed while sequentially changing the phase. That is, the controller 1 at step f111 increases n by 1 in order to acquire the horizontal start position at a next set phase, and then copies the current horizontal start position Pc to the previous horizontal start position Pp. Moreover, at step f112, the controller 1 sets a remainder of division of n by 32 to the phase of the clock generator 5, and then acquires the horizontal start position from the horizontal start/end position detector 7 after waiting the time corresponding to at least two vertical synchronization interrupt signals output from the synchronization detector 4 as the time until the threshold level setting is reflected to the output of the horizontal start/end position detector 7. Then, the controller 1 stores the acquired horizontal start position to the current horizontal start position Pc.

Figure 3:
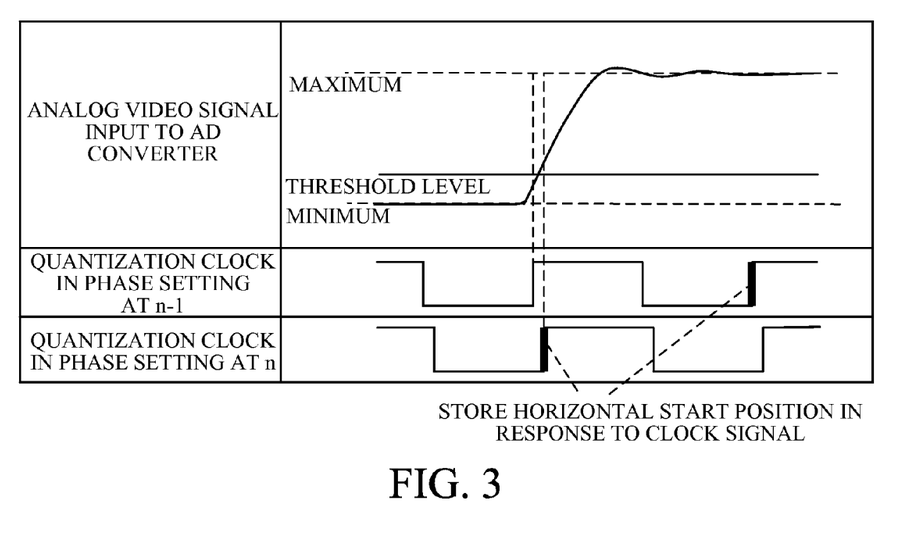
FIG. 3 shows an example of detection of a start position change phase in the embodiment.

In addition, at step f113, the controller 1 determines whether or not Pp is equal to Pc when n is or whether or not Pp-Pc is equal to 1 when n is other than 64. If both these conditions are not satisfied, the controller 1 returns to step f111 to keep searching for a value of n satisfying any one of these conditions. These conditions are conditions for determining whether or not the analog input video signal reaches the threshold level between the phases respectively set when the phase variables are n and n−1 as shown in FIG. 3. The reason why the phase for n=64 is treated separately from other phases is that the phase corresponds to a clock change point in response to which the horizontal start/end position detector 7 starts clock counting. If any one of the conditions is satisfied at step f113, the controller 1 proceeds to step f114.

At step f114, the controller 1 stores a current value of n to Sth[m], and decreases n by 1 and increases m by 1 in order to acquire the start position change phase at a next threshold level. The reason why n is decreased by 1 is to prepare the start of the start position change phase acquisition process at the next threshold level from n.

Next, at step f115, the controller 1 determines whether or not the start position change phase acquisition process has been performed to a maximum threshold level. If it has not been performed to the maximum threshold level yet, the controller 1 returns to step f108 to perform the start position change phase acquisition process at the next threshold level. According to the above-described process, in the transition of the analog video signal from the low level to the high level, the phases at which the analog video signal rises to at least two threshold levels are stored to the start position change phase Sth[].

Figure 1C:
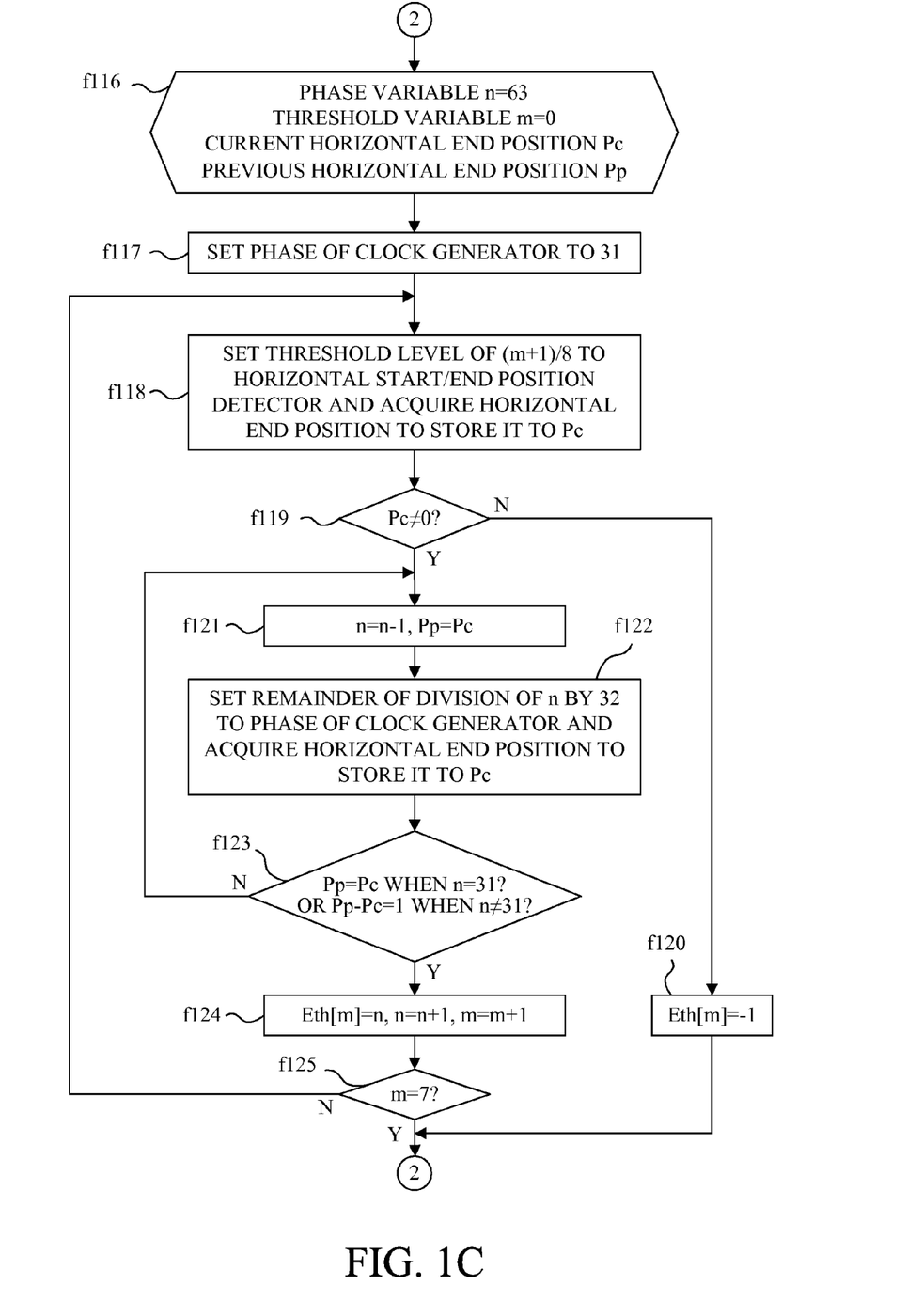
Figure 4A:
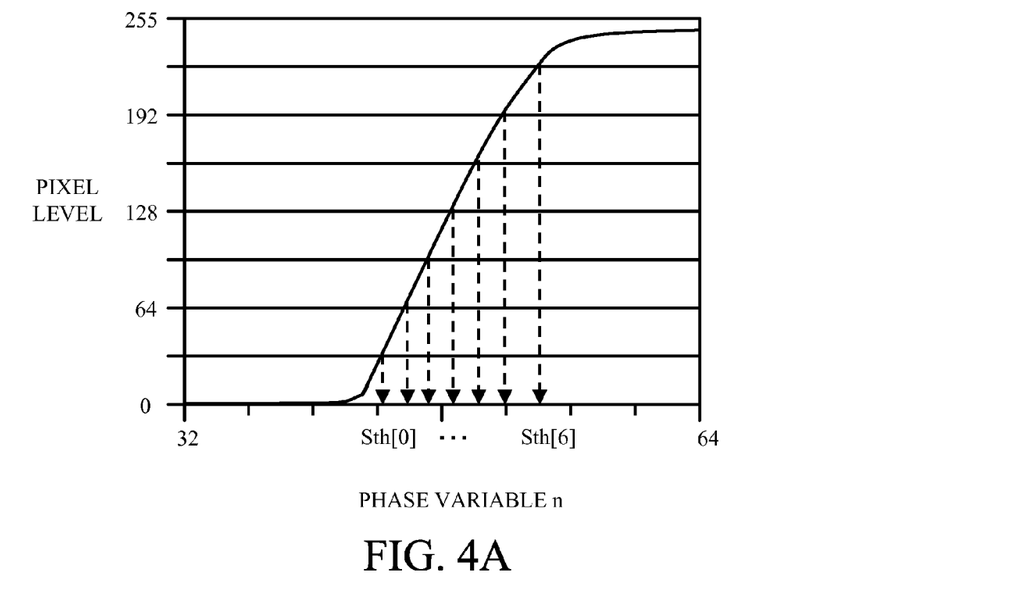
FIG. 4 shows detection examples of the start position change phase and an end position change phase in the embodiment.
Figure 4B:
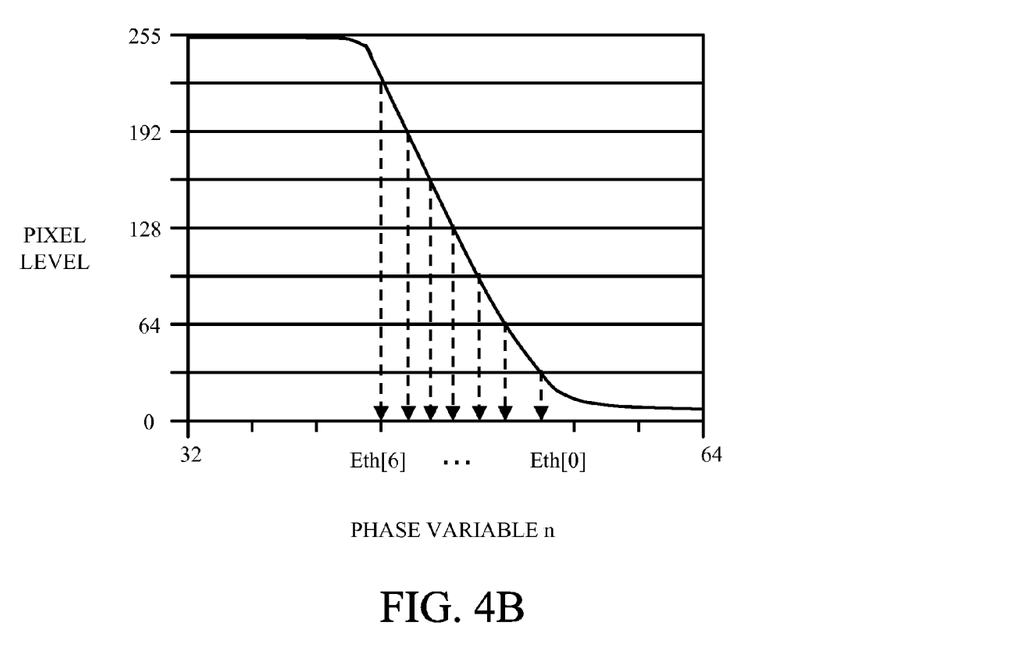

Next, detailed description will be made of operations in the end position change phase acquisition process (subroutine 2). The operations from step f116 to step f125 in the end position change phase acquisition process are different from those in the start position change phase acquisition process (subroutine 1) in that, since a level transition direction in the end position change phase acquisition process is reverse to that in the start position change phase acquisition process, the phase variable n is sequentially changed in a decreasing direction from an initial value of 63. Other operations in the end position change phase acquisition process are almost same as those in the start position change phase acquisition process. This process stores, to the end position change phase Eth[], the phases at which the analog video signal falls to at least two threshold levels in the transition from the high level to the low level. FIG. 4 shows the start position change phase Sth[] and the end position change phase Eth[].

Figure 1D:
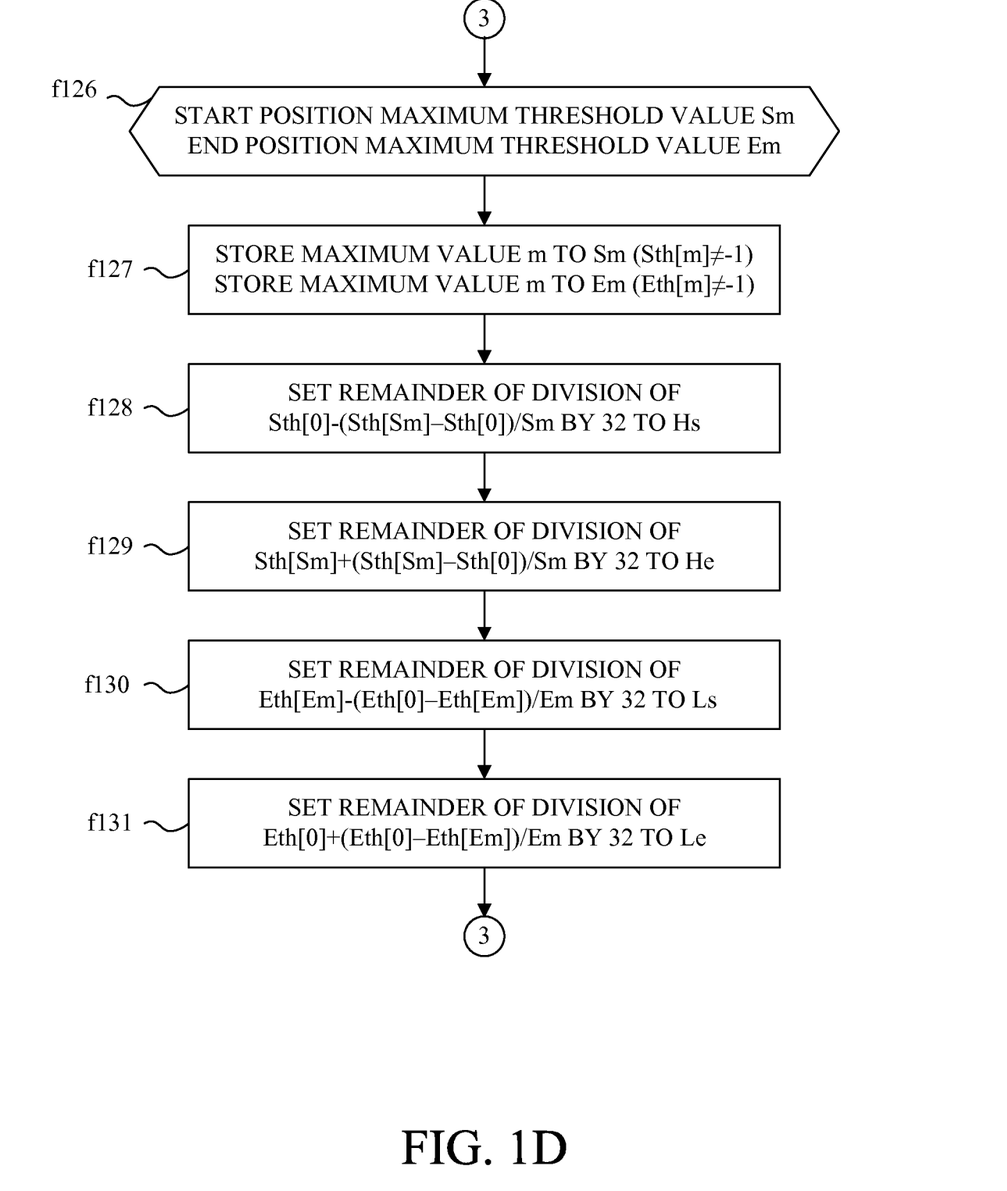

Next, detailed description will be made of operations in the high-level and low-level transition period calculation processes (subroutine 3).

At step f126, the controller 1 defines various variables. A start position maximum threshold value Sm and an end position maximum threshold value Em respectively stores maximum values of the threshold levels corresponding to effective phases stored in the array elements of the start position change phase Sth[] and the end position change phase Eth[].

At step f127, the controller 1 respectively stores, to the start position maximum threshold value Sm and the end position maximum threshold value Em, maximum values of m by which Sth[m] and Eth[m] do not become −1.

At step f128, the controller 1 subtracts, from a phase Sth[0] at which the analog video signal rises to a minimum threshold level in the high-level transition, an approximate phase increased value (Sth[Sm]−Sth[0])/Sm corresponding to one threshold level transition. Then, the controller 1 divides the subtracted phase by 32 corresponding to one clock period, and sets a remainder of the division to the high-level transition start phase Hs.

Figure 5:
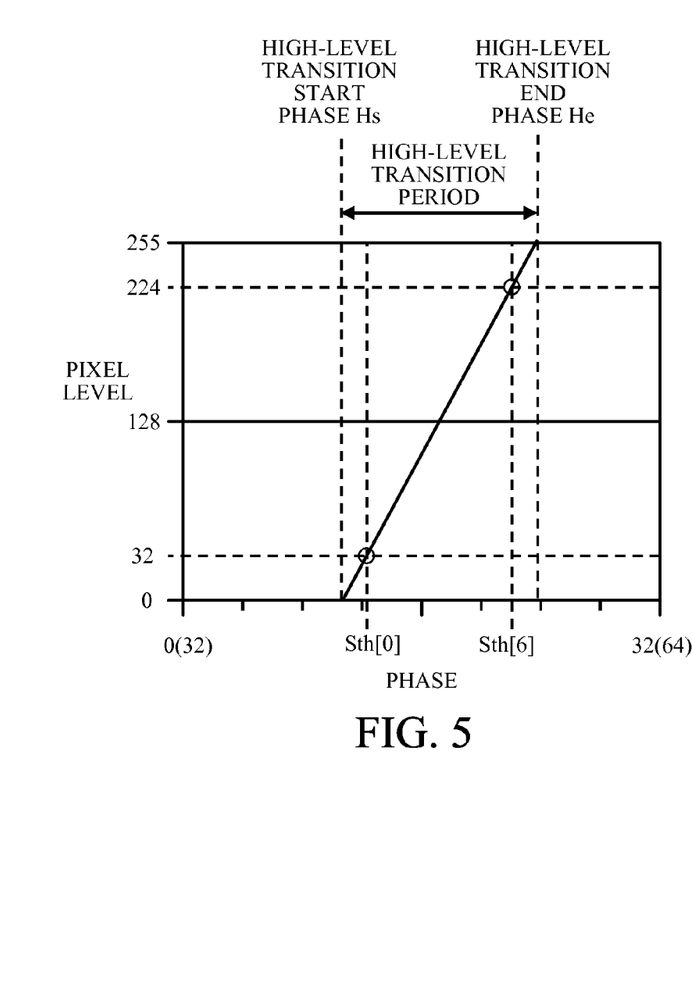
FIG. 5 shows a waveform example showing a high-level transition period in the embodiment.

At step f129, the controller 1 adds, to a phase Sth[m] at which the analog video signal rises to a maximum threshold level in the high-level transition, the approximate phase increased value (Sth[Sm]−Sth[0])/Sm corresponding to one threshold level transition. Then, the controller 1 sets a remainder of division of the added phase by 32 to the high-level transition end phase He. FIG. 5 shows an image of the high-level transition period.

At step f130, the controller 1 subtracts, from a phase Eth[Em] at which the analog video signal falls to a maximum threshold level in the low-level transition, an approximate phase increased value (Eth[0]−Eth[Em])/Em corresponding to one threshold level transition. Then, the controller 1 sets a remainder of division of the subtracted phase by 32 to the low-level transition start phase Ls.

Figure 6:
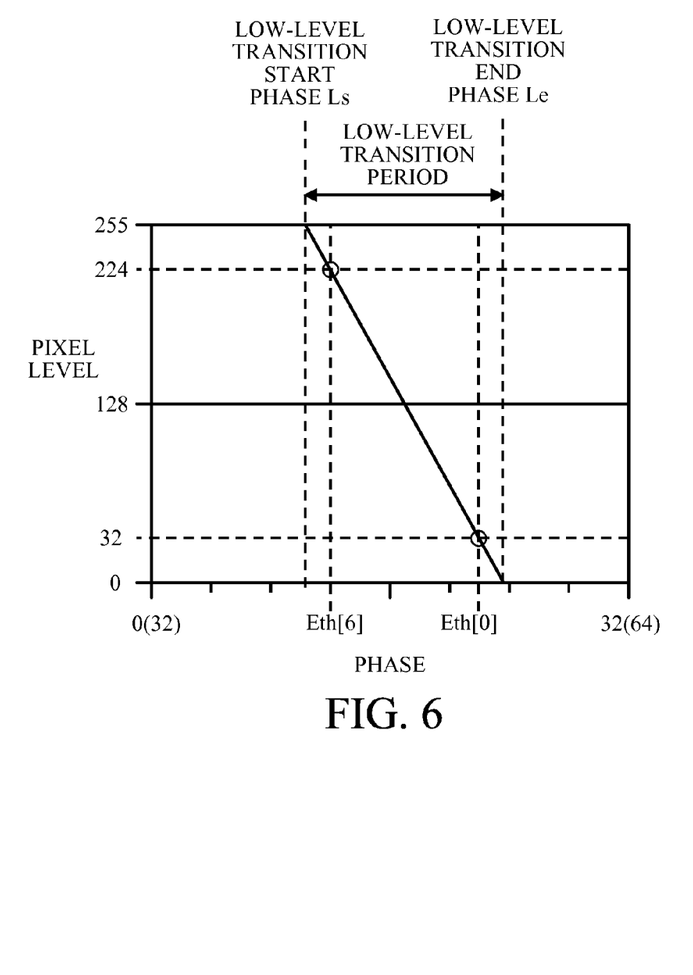
FIG. 6 shows a waveform example showing a low-level transition period in the embodiment.

At step f131, the controller 1 adds, to a phase Eth[0] at which the analog video signal falls to a minimum threshold level in the low-level transition, the approximate phase increased value (Eth[0]−Eth[Em])/Em corresponding to one threshold level transition. Then, the controller 1 sets a remainder of division of the added phase by 32 to the low-level transition end phase Le. FIG. 6 shows an image of the low-level transition period.

The above-described processes calculate the high-level transition start phase Hs, the high-level transition end phase He, the low-level transition start phase Ls and the low-level transition end phase Le, and store these phases.

As described above, in the automatic clock phase adjustment of this embodiment, the horizontal start/end position detector 7 covers the horizontal start and end positions of the whole lines in a vertical effective area, which can reduce influences of noise mixing into the video signal during its transmission and level change caused due to change of a source video itself. Therefore, accuracy of the automatic quantization clock phase adjustment can be improved.

Moreover, the output of the horizontal start/end position detector 7 is unaffected by even a video including few image areas where an inclination of change of a video level is reversed at each pixel. Therefore, this embodiment can provide for such a video a similar accuracy of the automatic quantization clock phase adjustment to those for other videos.

Furthermore, the start position change phase acquisition process (subroutine 1) performs, after previous acquisition of the start position change phase at a certain threshold level, subsequent acquisition of the start position change phase at a next threshold level, from the previously acquired phase without resetting the phase to 0. This makes it possible to reduce phase change frequency, thereby enabling shortening of the process.

The end position change phase acquisition process (subroutine 2) also provides a similar effect to that of the start position change phase acquisition process by reversing the sequentially changing direction of the phase. In addition, the end position change phase acquisition process (subroutine 2) can utilize the results of the start position change phase acquisition process (subroutine 1). That is, starting the sequential change of the phase from an initial phase obtained by adding some margin to the start position change phase at the maximum threshold level acquired by the start position change phase acquisition process (subroutine 1) can shorten the process.

Although this embodiment uses the horizontal end position detected by the horizontal start/end position detector 7 for acquiring the end position change phase, other methods may be employed for acquiring the end position change phase. For example, acquiring a width of a horizontal effective area or a width of a horizontal blanking area makes it possible to acquire the end position change phase on the basis of a relationship of the width and the horizontal start position.

Specifically, a horizontal effective width detector may be provided which detects, in a frame (same frame) including the horizontal start position, the width of the horizontal effective area from the horizontal start position to a horizontal end position where the output value of the AD converter 6 becomes a maximum value that exceeds a threshold level. In this case, the controller 1 may acquire, for each of at least two threshold levels and by sequentially changing an adjustable phase of the quantization clock, the start position change phase and the end position change phase where an added position obtained by addition of the width of the horizontal effective area to the horizontal start position is changed. Furthermore, the controller 1 may calculate, from the start position change phase, a low-level to high-level transition period (first phase period) of the analog video signal, and calculate, from the end position change phase, a high-level to low-level transition period (second phase period) thereof. Then, the controller 1 may set a phase that is not included in either of these transition periods as an adjusted phase of the quantization clock.

On the other hand, a horizontal blanking width detector may be provided which detects, in a frame (same frame) including the horizontal start position, the width of the horizontal blanking area from the horizontal end position where the output value of the AD converter 6 becomes a maximum value that exceeds a threshold level to the horizontal start position. In this case, the controller 1 may acquire, for each of at least two threshold levels and by sequentially changing an adjustable phase of the quantization clock, the start position change phase and the end position change phase where a subtracted position obtained by subtraction of the width of the horizontal blanking area from the horizontal start position is changed.

Furthermore, the controller 1 may calculate, from the start position change phase, a low-level to high-level transition period (first phase period) of the analog video signal, and calculate, from the end position change phase, a high-level to low-level transition period thereof. Then, the controller 1 may set a phase that is not included in either of the transition periods as an adjusted phase of the quantization clock.

Although this embodiment uses straight-line approximation in the high-level and low-level transition period calculation processes (subroutine 3), other approximation methods may be used.

Moreover, although this embodiment described the case of using both the horizontal start position and the horizontal end position, using only any one of them can also provide sufficient effects. Specifically, the controller 1 may acquire the start position change phase for each of at least two threshold levels by sequentially changing an adjustable phase of the quantization clock. Then, the controller 1 may calculate a low-level to high-level transition period (first phase period) of the analog video signal to set a phase that is not included in the low-level to high-level transition period as an adjusted phase of the quantization clock.

Alternatively, the controller 1 may acquire the end position change phase for each of at least two threshold levels by sequentially changing an adjustable phase of the quantization clock. Then, the controller may calculate a high-level to low-level transition period (second phase period) of the analog video signal to set a phase that is not included in the high-level to low-level transition period as an adjusted phase of the quantization clock.

Moreover, although this embodiment described the case of selecting the central point of the non-transition period for setting the appropriate phase (adjusted phase) in the appropriate phase setting process performed at step f105 as shown in FIG. 7, the appropriate phase may be any point in the non-transition period as long as the non-transition period has a sufficient margin. In particular, when a low-pass filter is provided in front of the AD converter 6, since the output from the AD converter 6 further approaches the source signal as the quantization clock phase is further delayed, it is desirable to select a point closer to the end point of the non-transition period than the central point.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-001508, filed on Jan. 6, 2010, which is hereby incorporated by reference herein in its entirety.

What is claimed is:

1. A display apparatus comprising:
   an AD converter configured to convert an analog video signal into a digital video signal;
   a phase adjuster configured to adjust a phase of a quantization clock in the AD converter with respect to the analog video signal;
   a horizontal start position detector configured to detect a horizontal start position where an output value of the AD converter becomes a minimum value that exceeds a threshold level in a video horizontal direction; and
   a threshold level adjuster configured to adjust the threshold level,
   wherein the phase adjuster is configured to perform a quantization clock phase adjustment process comprising the following processes:
   a phase acquisition process to acquire, by sequentially changing an adjustable phase of the quantization clock, a start position change phase thereof which changes the horizontal start position detected by the horizontal start position detector, the phase acquisition process being performed for each of at least two different threshold levels;
   a first phase period calculation process to calculate, from the start position change phases acquired for the at least two threshold levels, a first phase period where the analog video signal starts its transition from a first level to a second level higher than the first level and then ends the transition; and
   a phase setting process to set a phase that is not included in the first phase period as an adjusted phase of the quantization clock.

2. A display apparatus according to claim 1, further comprising:
   a horizontal end position detector configured to detect a horizontal end position where the output value of the AD converter becomes a maximum value that exceeds the threshold level in the video horizontal direction,
   wherein the phase acquisition process acquires, by sequentially changing the adjustable phase of the quantization clock, the start position change phase thereof and an end position change phase thereof which changes the horizontal end position detected by the horizontal end position detector, the phase acquisition process to acquire each of the start and end position change phases being performed for each of at least two different threshold levels,
   wherein the quantization clock phase adjustment process further comprising:
   a second phase period calculation process to calculate, from the end position change phases acquired for the at least two threshold levels, a second phase period where the analog video signal starts its transition from the second level to the first level and then ends the transition, and
   wherein the phase setting process sets a phase that is not included in either of the first and second phase periods as the adjusted phase of the quantization clock.

3. A display apparatus according to claim 1, further comprising:
   a horizontal effective width detector configured to detect, in a frame including the horizontal start position, a width of a horizontal effective area from the horizontal start position to a horizontal end position where the output value of the AD converter becomes a maximum value that exceeds the threshold level in the video horizontal direction,
   wherein the phase acquisition process acquires, by sequentially changing the adjustable phase of the quantization clock, the start position change phase thereof and an end position change phase thereof which changes an added position obtained by addition of the width of the horizontal effective area to the horizontal start position, the phase acquisition process to acquire each of the start and end position change phases being performed for each of at least two different threshold levels,
   wherein the quantization clock phase adjustment process further comprising:
   a second phase period calculation process to calculate, from the end position change phases acquired for the at least two threshold levels, a second phase period where the analog video signal starts its transition from the second level to the first level and then ends the transition, and
   wherein the phase setting process sets a phase that is not included in either of the first and second phase periods as the adjusted phase of the quantization clock.

4. A display apparatus according to claim 1, further comprising:
   a horizontal blanking width detector configured to detect, in a frame including the horizontal start position, a width of a horizontal blanking area from a horizontal end position where the output value of the AD converter becomes a maximum value that exceeds the threshold level in the video horizontal direction to the horizontal start position,
   wherein the phase acquisition process acquires, by sequentially changing the adjustable phase of the quantization clock, the start position change phase thereof and an end position change phase thereof which changes a subtracted position obtained by subtraction of the width of the horizontal blanking area from the horizontal start position, the phase acquisition process to acquire each of the start and end position change phases being performed for each of at least two different threshold levels, wherein the quantization clock phase adjustment process further comprising:

a second phase period calculation process to calculate, from the end position change phases acquired for the at least two threshold levels, a second phase period where the analog video signal starts its transition from the second level to the first level and then ends the transition, and wherein the phase setting process sets a phase that is not included in either of the first and second phase periods as the adjusted phase of the quantization clock.

5. A display apparatus according to claim 1, wherein the phase acquisition process performs, after previous acquisition of the start position change phase for one of the threshold levels, subsequent acquisition of the start position change phase for a next one of the threshold levels, from the previously acquired phase without resetting the phase to 0.

6. A display apparatus according to claim 2, wherein the phase acquisition process starts the sequential change of the adjustable phase for acquiring the end position change phase from an initial phase obtained by adding a margin to the start position change phase for a maximum one of the threshold levels.

7. A display apparatus according to claim 2, wherein the phase setting process sets as the adjusted phase a central point of a non-transition period that is not included in either of the first and second phase periods.

8. A display apparatus comprising:

an AD converter configured to convert an analog video signal into a digital video signal;

a phase adjuster configured to adjust a phase of a quantization clock in the AD converter with respect to the analog video signal;

a horizontal end position detector configured to detect a horizontal end position where an output value of the AD converter becomes a maximum value that exceeds a threshold level in a video horizontal direction; and a threshold level adjuster configured to adjust the threshold level, wherein the phase adjuster is configured to perform a quantization clock phase adjustment process comprising the following processes:

a phase acquisition process to acquire, by sequentially changing an adjustable phase of the quantization clock, an end position change phase thereof which changes the horizontal end position detected by the horizontal end position detector, the phase acquisition process being performed for each of at least two different threshold levels;

a second phase period calculation process to calculate, from the end position change phases acquired for the at least two threshold levels, a second phase period where the analog video signal starts its transition to a first level from a second level higher than the first level and then ends the transition; and a phase setting process to set a phase that is not included in the second phase period as an adjusted phase of the quantization clock.

* * * * *